United States Patent
Sarpatwari et al.

(10) Patent No.: US 11,538,513 B2
(45) Date of Patent: Dec. 27, 2022

(54) MEMORY ELEMENT FOR WEIGHT UPDATE IN A NEURAL NETWORK

(71) Applicant: Micron Technology, Inc., Boise, ID (US)

(72) Inventors: Karthik Sarpatwari, Boise, ID (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 657 days.

(21) Appl. No.: 16/542,975

(22) Filed: Aug. 16, 2019

(65) Prior Publication Data
US 2021/0050045 A1  Feb. 18, 2021

(51) Int. Cl.
| | | |
|---|---|---|
| *G11C 11/16* | (2006.01) | |
| *G11C 11/56* | (2006.01) | |
| *G06F 13/16* | (2006.01) | |
| *G06F 7/58* | (2006.01) | |
| *G06N 3/063* | (2006.01) | |

(52) U.S. Cl.
CPC .......... *G11C 11/1675* (2013.01); *G06F 7/588* (2013.01); *G06F 13/1668* (2013.01); *G06N 3/063* (2013.01); *G11C 11/5607* (2013.01)

(58) Field of Classification Search
CPC ............ G11C 11/1675; G11C 11/5607; G11C 2013/0054; G11C 11/5678; G11C 13/0004; G11C 13/0069; G11C 2213/71; G11C 2213/77; G11C 11/54; G11C 13/0002; G11C 13/004; G06F 7/588; G06F 13/1668; G06N 3/063; G06N 3/0635; G06N 3/08
See application file for complete search history.

(56) References Cited

U.S. PATENT DOCUMENTS

| | | |
|---|---|---|
| 9,189,729 B2 | 11/2015 | Arthur et al. |
| 9,430,735 B1 | 8/2016 | Vali et al. |
| 9,575,727 B2 | 2/2017 | Sarpatwari et al. |
| 10,614,355 B2 | 4/2020 | Lee |
| 2009/0083202 A1 | 3/2009 | Tanaka et al. |
| 2015/0278682 A1 | 10/2015 | Saxena |
| 2017/0068885 A1 | 3/2017 | Alvarez-Icaza |
| 2017/0125097 A1 | 5/2017 | Tortorelli et al. |

(Continued)

FOREIGN PATENT DOCUMENTS

| | | | |
|---|---|---|---|
| EP | 3343462 A1 * | 7/2018 | ............. G06F 7/582 |
| KR | 10-2017-0080440 A | 7/2017 | |
| WO | 2014-080300 A1 | 5/2014 | |

OTHER PUBLICATIONS

International Search Report and Written Opinion from related International Application No. PCT/US2020/044957, dated Nov. 11, 2020, 14 pages.

(Continued)

*Primary Examiner* — Ajay Ojha
(74) *Attorney, Agent, or Firm* — Brooks, Cameron & Huebsch, PLLC

(57) ABSTRACT

An output, representing synaptic weights of a neural network can be received from first memory elements. The output can be compared to a known correct output. A random number can be generated with a tuned bias via second memory elements. The weights can be updated based on the random number and a difference between the output and the known correct output.

25 Claims, 6 Drawing Sheets

(56) References Cited

U.S. PATENT DOCUMENTS

2019/0164600 A1  5/2019  Castro
2019/0198105 A1  6/2019  Pirovano

OTHER PUBLICATIONS

Ambrogio, et al., "Unsupervised Learning by Spike Timing Dependent Plasticity in Phase Change Memory (PCM) Synapses", vol. 10, Article 56, Mar. 8, 2016, 12 pages.
Ambrogio, et al., "Neuromorphic Learning and Recognition With One-Transistor-One-Resistor Synapses and Bistable Metal Oxide RRAM", IEEE Transactions on Electron Devices, vol. 63, No. 4, Apr. 2016, 8 pages.
U.S. Appl. No. 16/001,790, entitled "Weight Storage Using Memory Device", filed Jun. 6, 2018, 58 pages.
Office Action from related Taiwan Patent Application No. 109127673, dated May 24, 2021, 13 pages.

\* cited by examiner

MEMORY ELEMENT FOR WEIGHT UPDATE IN A NEURAL NETWORK

TECHNICAL FIELD

The present disclosure relates generally to semiconductor memory and methods, and more particularly, to a memory element for weight update in a neural network.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and static random access memory (SRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory, such as phase change random access memory (PCRAM), three-dimensional cross-point memory (e.g., 3D XPoint™), resistive random access memory (RRAM), ferroelectric random access memory (FeRAM), magnetoresistive random access memory (MRAM), and programmable conductive memory, among other types of memory.

A physical layout of a resistance variable memory device may resemble that of a DRAM device where the capacitor of the DRAM cell is replaced by a phase change material (e.g., Germanium-Antimony-Telluride (GST) or other chalcogenide materials). An access device such as a diode or metal oxide semiconductor field effect transistor (MOSFET) can be connected in series with the phase change material. Chalcogenide materials can include compounds of sulfides, selenides, and tellurides, among others. A physical layout of an RRAM device may include memory cells including a resistance variable thin film (e.g., a colossal magnetoresistive material). The thin film can be connected to an access device such as a diode, a field effect transistor (FET), or a bipolar junction transistor (BJT).

Memory cells can be programmed to a programmed level. The resistance of a resistance variable memory device can be altered by applying energy pulses to the resistance variable material. For example, material properties of a phase change material may be altered by heating it with a programming current. Generally, a higher resistance level may be associated with a more amorphous state (e.g., a RESET state) of the phase change material, and a lower resistance level may be associated with a more crystalline state (e.g., a SET state) of the phase change material. The resistance of a thin film RRAM device can be increased and/or decreased by applying positive and/or negative electrical pulses across the film.

Neural networks are networks that process information by modeling a network of neurons, such as neurons in a human brain, to process information (e.g., stimuli) that has been sensed in a particular environment. Similar to a human brain, neural networks typically include multiple neuron models to process information, which can be referred to as artificial neurons.

DETAILED DESCRIPTION

Figure 1:
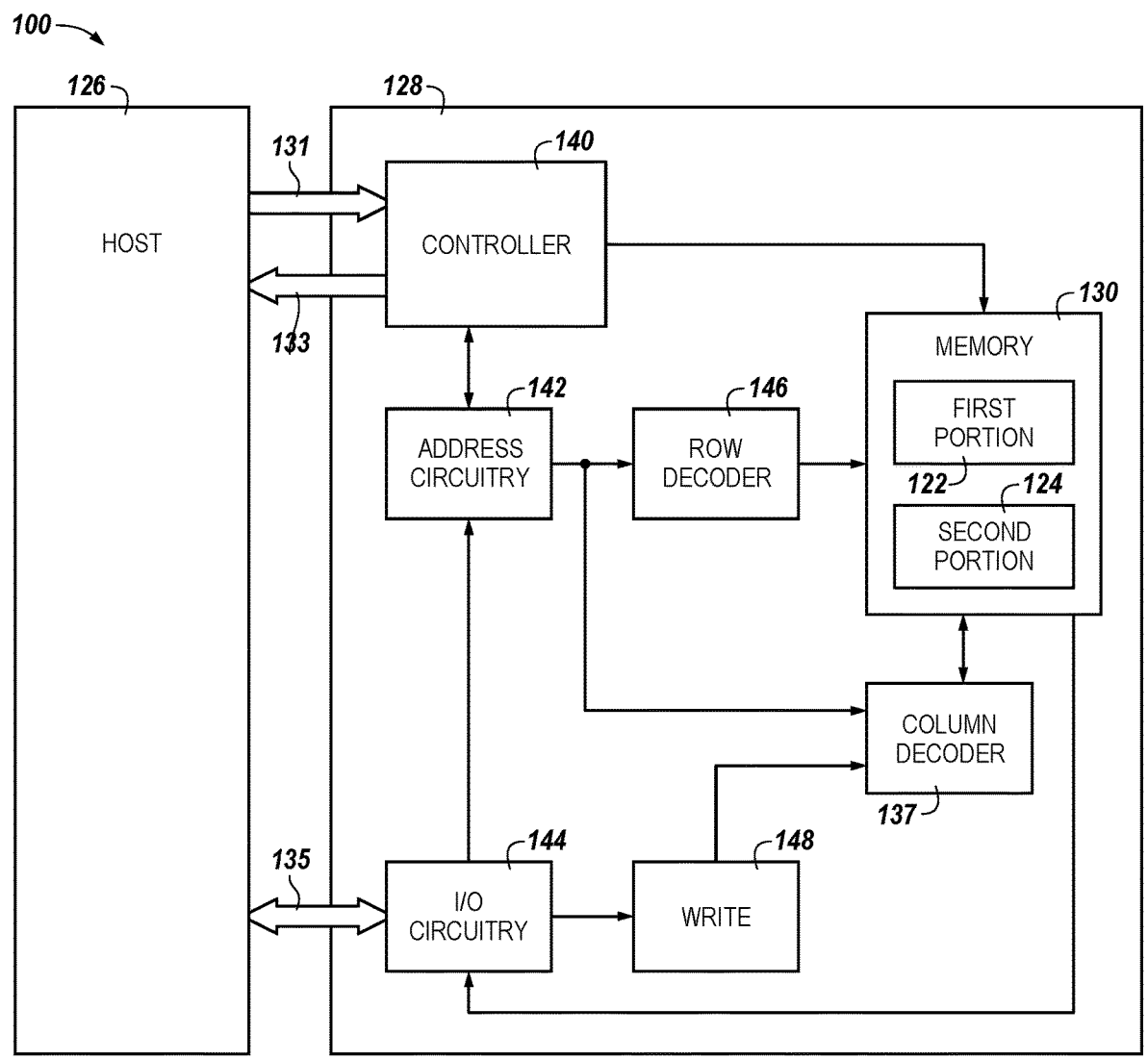
FIG. 1 is a block diagram of an apparatus in the form of a computing system including a memory device according to a number of embodiments of the present disclosure.

Various attempts have been made to implement neural networks in memory devices. For example, in some previous implementations of neural networks, memory cells have operated to emulate neural models to facilitate one or more neural network operating characteristics in a memory.

The embodiments disclosed herein improve upon previous approaches, involving memories to facilitate neural network operations, by including weighted inputs to the neuron models to account for the relative influence of the inputs on the neuron. A weight, which may also be referred to as a synaptic weight, can correspond to a strength of a synapse in a human brain, for example. Furthermore, the weights can be changed randomly, and the randomness of the change can be biased to improve learning, without the need for additional circuitry.

For example, an output, representing synaptic weights of a neural network, can be received from first memory elements. The output can be compared to a known correct output. A random number can be generated with a tuned bias via second memory elements. The weights can be updated based on the random number and a difference between the output and the known correct output.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" a particular thing can refer to one or more of such things (e.g., a number of memory devices can refer to one or more memory devices). As used herein, the terms "first" and "second" are used to differentiate between one feature from another and do not necessarily imply an order between the features so designated. For example, "a first physical address" does not necessarily imply that the first physical address came before "a second physical address." As used herein, "random" refers to various degrees of unpredictability regarding random data generation, including, without limitation, pseudorandom, random, apparent randomness, true randomness, and the like.

As used herein, the singular forms "a", "an", and "the" include singular and plural referents unless the content clearly dictates otherwise. Furthermore, the word "may" is used throughout this application in a permissive sense (i.e., having the potential to, being able to), not in a mandatory sense (i.e., must). The term "include," and derivations thereof, mean "including, but not limited to." The term "coupled" means directly or indirectly connected.

The figures herein follow a numbering convention in which the first digit or digits correspond to the drawing figure number and the remaining digits identify an element or component in the drawing. Similar elements or components between different figures may be identified by the use of similar digits. For example, 410 may reference element "10" in FIG. 4, and a similar element may be referenced as 510 in FIG. 5. Analogous elements within a Figure may be referenced with a hyphen and extra numeral or letter. See, for example, elements 210-1, 210-2, and 210-N in FIG. 2. Such analogous elements may be generally referenced without the hyphen and extra numeral or letter. For example, elements 210-1, 210-2, and 210-N may be collectively or generally referenced as 210. As used herein, the designators "N", "M", and "P", particularly with respect to reference numerals in the drawings, indicates that a number of the particular feature so designated can be included. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present disclosure and should not be taken in a limiting sense.

FIG. 1 is a block diagram of an apparatus in the form of a computing system 100 including a memory device 128 according to a number of embodiments of the present disclosure. As used herein, a memory device 128, controller 140, and memory 130, might also be separately considered an "apparatus."

In this example, the system 100 includes a host 126 coupled to the memory device 128, which includes a memory 130. The memory 130 can represent one or more memory arrays. The host 126 can be a host system such as a personal laptop computer, a desktop computer, a digital camera, a smart phone, or a memory card reader, among various other types of hosts. The host 126 can include a system motherboard and/or backplane and can include a number of processing resources (e.g., one or more processors, microprocessors, or some other type of controlling circuitry). The system 100 can include separate integrated circuits or both the host 126 and the memory device 128 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory 130 can include a first portion 122 and a second portion 124. The first portion 122 can include a first plurality of memory elements and the second portion 124 can include a second plurality of memory elements. As used herein a memory element is a memory cell or a portion of a memory cell, such as a storage component of a memory cell. The first portion 122 can be any type of memory, such as a DRAM array, a self-selecting memory (SSM) array, a 3-dimensional (3D) cross-point memory array, SRAM array, STT RAM array, PCRAM array, TRAM array, RRAM array, NAND flash array, and/or NOR flash array, for instance. The second portion 124 can be any type of variable resistance memory. For example, memory elements of the second portion 124 can include a phase change material. In at least one embodiment, the first portion 122 and the second portion 124 comprise portions of a single array of memory elements. Either portion of the memory 130 can comprise memory cells arranged in rows coupled by access lines (which may be referred to as word lines or select lines) and columns coupled by sense lines (which may be referred to as bit lines, data lines, or digit lines).

The memory device 128 includes address circuitry 142 to latch address signals provided over a bus 135 (e.g., an I/O bus) through I/O circuitry 144. Address signals are received through the address circuitry 142 and decoded by a row decoder 146 and a column decoder 137 to access the memory 130. The address signals can also be provided to the controller 140 (e.g., via the address circuitry 142 and/or via a control bus 131). Data can be read from the memory 130 by sensing voltage and/or current changes on the data lines using sensing circuitry (not illustrated). The sensing circuitry can read and latch a page (e.g., row) of data from the memory 130. The I/O circuitry 144 can be used for bi-directional data communication with the host 126 over the I/O bus 135. The write circuitry 148 is used to write data to the memory 130.

The controller 140 (e.g., memory controller), which may be referred to as bank control logic and/or a sequencer, decodes signals provided by control bus 131 from the host 126. These signals can include chip enable signals, write enable signals, and address latch signals that are used to control operations performed on the memory 130, including data read, data write, and data erase operations. In various embodiments, the controller 140 is responsible for executing instructions from the host 126 and sequencing access to the array 130. The controller 140 can be a state machine, a sequencer, or some other type of controller.

The controller 140 can control the operation (e.g., read, write, re-write, refresh, discharge) of memory cells through the various components. In some cases, one or more of the row decoder 146 and the column decoder 137 can be co-located with the controller 140. The controller 140 can generate row and column address signals in order to activate a desired access line and sense line. The controller 140 can also generate and control various voltages or currents used during the operation of a memory array. In general, the amplitude, shape, polarity, and/or duration of an applied voltage or current discussed herein can be adjusted or varied and may be different for the various operations discussed in operating the memory 130.

The controller 140 can be configured to perform additional functions as described herein. For example, the controller 140 can be configured to compare an output of the first plurality of memory elements (of the first portion 122 of memory 130), representing synaptic weights of a neural network, to a known correct output. For example, the controller 140 can be configured to perform the comparison during a learning phase of a neural network associated with (e.g., implemented by) the memory device 128. The controller 140 can be configured to cause the second plurality of memory elements (of the second portion 124 of memory 130) to generate a random number with a tuned bias based on a difference between the output of the first plurality of memory elements and the known correct output. The controller 140 can be configured to program the first plurality of memory elements to store updated synaptic weights based on the random number.

Figure 2:
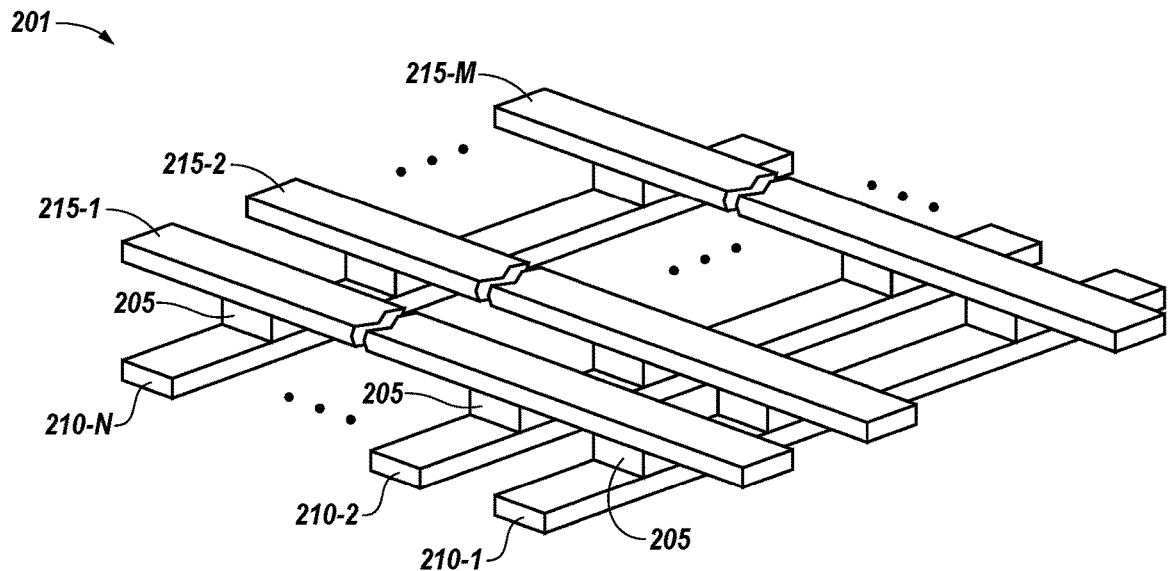
FIG. 2 illustrates a portion of an array of memory cells in a cross-point architecture according to a number of embodiments of the present disclosure.

FIG. 2 illustrates a portion of an array 201 of memory cells in a cross-point architecture according to a number of embodiments of the present disclosure. In some embodiments, the array 201 can be analogous to the first portion 122 and/or the second portion 124 of the memory 130 illustrated in FIG. 1. In the example illustrated in FIG. 2, the array 201 is a cross-point array including access lines 210-1, 210-2, ..., 210-N, and sense lines 215-1, 215-2, ..., 215-M. A memory cell 205 is located at each of the intersections of the word lines 210 and bit lines 215 and the memory cells 205 can function in a two-terminal architecture, for example, with a particular access line 210 and sense line 215 serving as the electrodes for the memory cells 205. The memory cells 205 are illustrated generally as blocks. Examples of memory cells with additional detail shown are illustrated and described with respect to FIGS. 4-5.

The memory cells 205 can be resistance variable memory cells. The memory cell 205 can include a resistance variable material programmable to different data states (e.g., chalcogenide). For instance, the memory cell 205 may be written to store particular levels corresponding to particular data states responsive to applied writing voltage and/or current pulses, for instance. Embodiments are not limited to a particular material or materials. For instance, the material can be a chalcogenide formed of various doped or undoped materials. Other examples of materials that can be used to form storage elements include binary metal oxide materials, colossal magnetoresistive materials, and/or various polymer-based resistance variable materials, among others.

In operation, the memory cells 205 of array 201 can be written to by applying a programming pulse (e.g., a write voltage) across the memory cells 205 via selected access lines 210 and sense lines 215. A sensing (e.g., read) operation can be used to determine the data state of a memory cell 205 by sensing current, for example, on a sense line 215 corresponding to the respective memory cell responsive to a particular voltage applied to the selected access line to which the respective cell is coupled.

Figure 3:
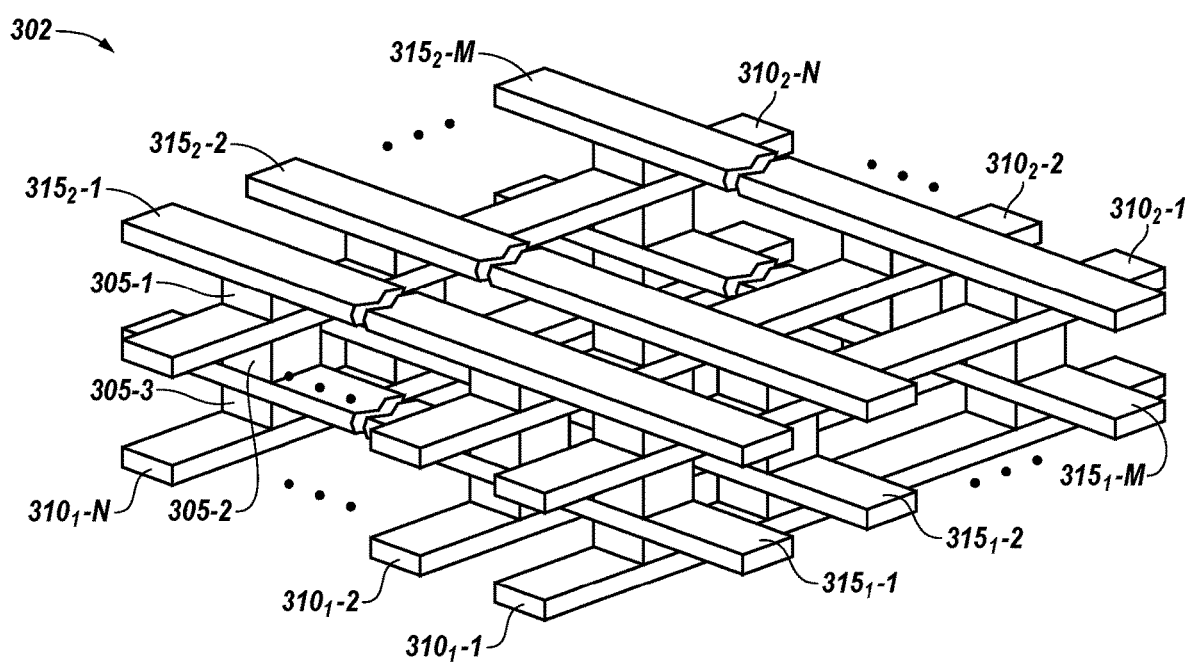
FIG. 3 illustrates a portion of a three-dimensional array of memory cells according to a number of embodiments of the present disclosure.

FIG. 3 illustrates a portion of a three-dimensional array 302 of memory cells according to a number of embodiments of the present disclosure. In some embodiments, the array 302 can be analogous to the first portion 122 and/or the second portion 124 of the memory 130 illustrated in FIG. 1. In the example illustrated in FIG. 3, the array 302 is configured in a cross-point memory array architecture (e.g., a three-dimensional (3D) cross-point memory array architecture). The multi-deck cross-point memory array 302 includes a number of successive memory cells (e.g., 305-1, 305-2, 305-3) disposed between alternating (e.g., interleaved) decks of access lines $310_1$-1, $310_1$-2, ..., $310_1$-N and $310_2$-1, $310_2$-2, ..., $310_2$-N extending in a first direction and sense lines $315_1$-1, $315_1$-2, ..., $315_1$-M and $315_2$-1, $315_2$-2, ..., $315_2$-M extending in a second direction. The number of decks can be expanded in number or can be reduced in number. Each of the memory cells 305 can be arranged between access lines 310 and sense lines 315, such that a single memory cell 305 is directly electrically coupled with and is electrically in series with its respective sense line and access line. For example, the array 302 can include a three-dimensional matrix of individually addressable (e.g., randomly accessible) memory cells that can be accessed for operations at a granularity as small as a single storage components or multiple storage components.

Figure 4:
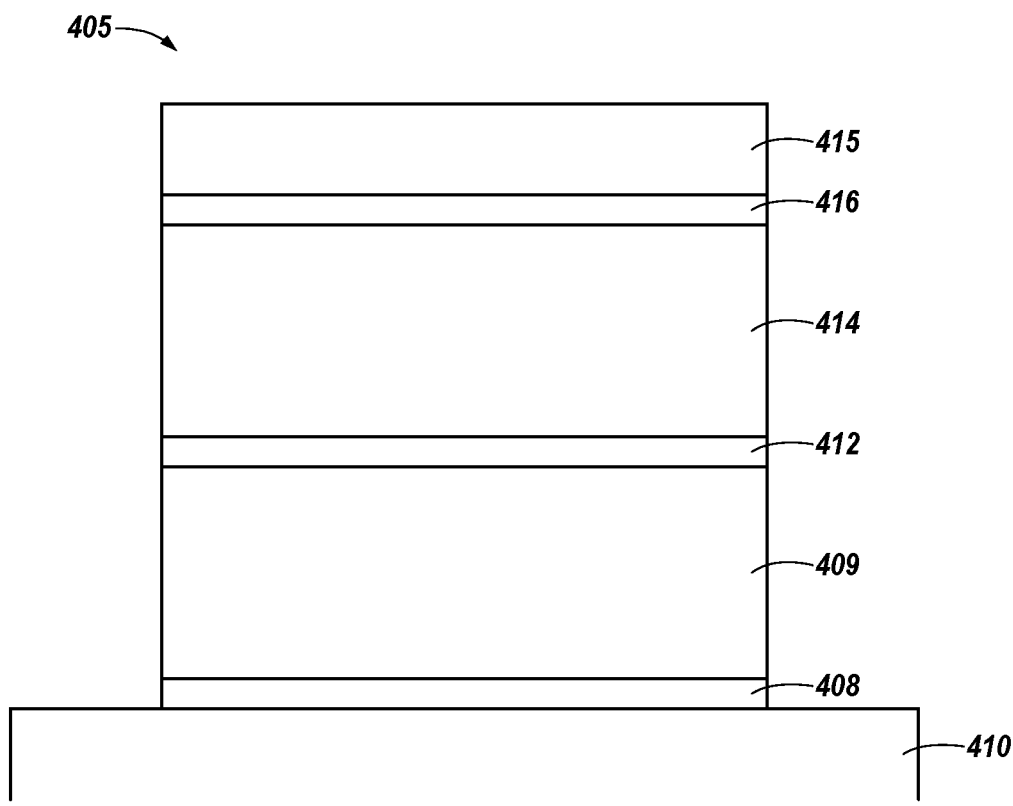
FIG. 4 illustrates a portion of a memory array including a memory cell with a selection component according to a number of embodiments of the present disclosure.

FIG. 4 illustrates a portion of a memory array including a memory cell 405 with a selection component 409 according to a number of embodiments of the present disclosure. The portion of the memory array described with respect to FIG. 4 can be used as the first portion 122 and/or the second portion 124 of the memory 130 described with respect to FIG. 1. The illustration includes an access line 410 and a sense line 415. The access line 410 extends parallel to the plane of the page, and the sense line 415 extends into the plane of the page, perpendicular to the access line 410. A selection component 409 can be located at an intersection of the access line 410 and the sense line 415. The selection component 409 can be coupled to the access line 410 by a first electrode 408 and coupled to a second electrode 412. The second electrode 412 can couple the selection component 409 to a storage component 414. The storage component 414 can be coupled to the sense line 415 by a third electrode 416. The storage component 414 can include a layer of resistance variable material.

In some embodiments, the resistance variable material can be a chalcogenide material and/or a phase change material, but other materials can be used. A phase change material can include a number of Germanium-Antimony-Tellurium (GST) materials, e.g., Ge—Sb—Te such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include GeTe, In—Se, $Sb_2Te_3$, GaSb, InSb, As—Te, and Al—Te. Additional phase change materials can include Ge—Sb—Te, Te—Ge—As, In—Sb—Te, Te—Sn—Se, Ge—Se—Ga, Bi—Se—Sb, Ga—Se—Te, Sn—Sb—Te, and In—Sb—Ge. Some phase change memories may include a phase change material such as Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. As used herein, a "memory element" can refer to the memory cell 405 or to one or more components of the memory cell, such as the storage component 414 and/or the selection component 409, but at least refers to the storage component 414.

In some architectures, the storage component 414 (e.g., a resistive component in a CBRAM cell, a capacitive component in a FeRAM cell, a phase change component in a PCRAM cell) may be electrically isolated from the access line 410 by a selection component 409. The term "isolated" refers to a relationship between components in which electrons are not presently capable of flowing between them.

Components are isolated from each other if there is an open circuit between them. For example, two components physically connected by a switch may be isolated from each other when the switch is open. Although not specifically illustrated as such, the selection component 409 can be, for example, a three-terminal transistor and the access line 410 may be connected to the gate of the transistor, where the transistor is coupled to a common source line. Alternatively, the selection component may be a variable resistance component, which may comprise chalcogenide material. Another example of a selection component is a diode.

The signals for operating a memory cell 405 can be applied to a selection component 409 and/or to a storage component 414 as shown in FIG. 4. The signals can be applied, for example, via the access line 410 and/or sense line 415, for example, in conjunction with operation of the first electrode 408, second electrode 412, and/or third electrode 416. The memory element (e.g., including the selection component 409 and storage component 414) can have a threshold voltage thereof be changed to represent different synaptic weights as described herein. In some embodiments, the threshold voltage effects of the different read and write polarities can be additive across the selection component 409 and the storage component 414.

For those embodiments in which, the storage component 414 comprises a phase change material, the threshold voltage of the memory element can be based on a state of the phase change material (e.g., amorphous, crystalline, etc.). Chalcogenide materials, for example, can be repeatedly altered from an amorphous to a crystalline state based on the manner in which the material is heated and/or cooled to the solidified state. Thus, an electrical current can be used to fix the chalcogenide material into an amorphous or a crystalline state depending on various current characteristics that affect heating and/or cooling. For example, higher level currents are generally used to RESET the chalcogenide material to a high resistivity (low conductivity) or amorphous state, while lower level currents are generally used to SET the chalcogenide material to a low resistivity (high conductivity) or crystalline state. Either of these nonvolatile states of the material are thus maintained until a subsequent electrical current alters the structure of the chalcogenide. Additionally, in some cases chalcogenide materials can also be solidified into different states along the range from amorphous to crystalline.

Figure 5:
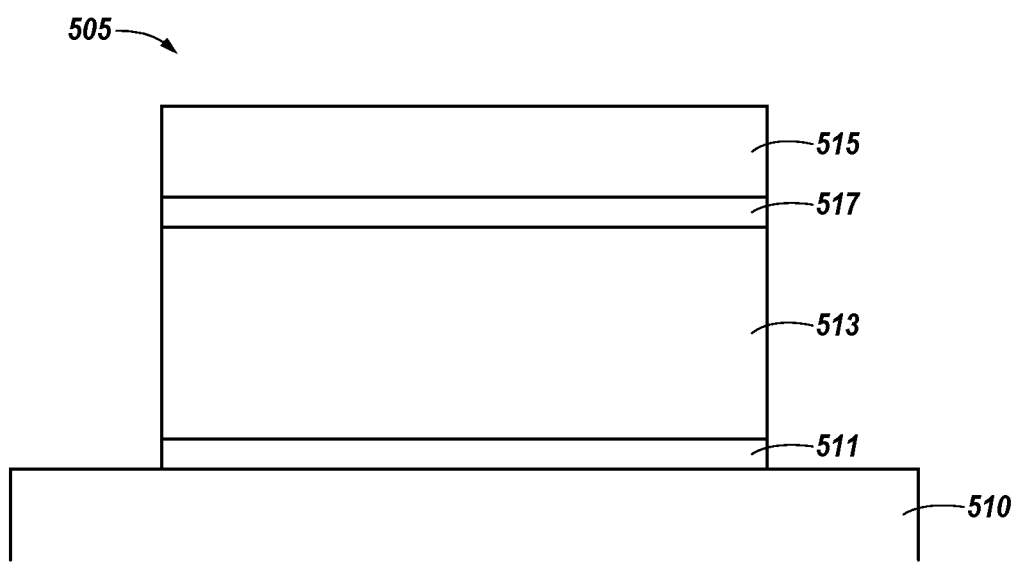
FIG. 5 illustrates of a portion of a memory array including a self-selecting memory cell according to a number of embodiments of the present disclosure.

FIG. 5 illustrates of a portion of a memory array including a self-selecting memory cell 505 according to a number of embodiments of the present disclosure. The portion of the memory array described with respect to FIG. 5 can be used as the first portion 122 and/or the second portion 124 of the memory 130 described with respect to FIG. 1. The illustration includes an access line 510 and a sense line 515. The access line 510 is perpendicular to the sense line 515. As shown in FIG. 5, the access line 510 extends parallel to the page and the sense line 515 extends into the page. The memory cell 505 can include a memory element 513 comprised of a variable resistance material, such as a phase change material (e.g., a chalcogenide). The memory element 513 can act as both a selection component and a storage component. The memory element 513 can be located at an intersection of the access line 510 and the sense line 515. The memory element 513 can be coupled to the access line 510 by a first electrode 511 and coupled to the sense line 515 by a second electrode 517. In some embodiments, the memory element 513 can include a ternary composition that can include selenium (Se), arsenic (As), and germanium (Ge). In some embodiments, the memory element 513 can include a quaternary composition that can include silicon (Si), Se, As, and Ge. Other materials can also be used.

The memory cell 505 can be written to store one of at least two different data states (e.g., '1,' '0') by a write operation. The two data states may also be referred to as SET and RESET. In some embodiments, the different data states can be represented by different threshold voltages of the memory cell 505. For example, a '1' data state can be represented by a first threshold voltage and a '0' data state can be represented by a second threshold voltage. The threshold voltage the memory cell 505 exhibits can be based on a polarity of a write pulse applied to the memory cell 505 during a write operation and a polarity of a read pulse applied to the memory cell 505 during a read operation. The write pulse and read pulse can be applied to the memory cell 505 using the access line 510 and the sense line 515.

The memory cell 505 can be configured as a two-terminal device between the sense line 515 and access line 510 in some embodiments. A first data state can be written to the memory cell 505 by applying a voltage (e.g., a write pulse) across the memory cell 505 in a first polarity. A second data state can be written to the memory cell 505 by applying a voltage (e.g., a write pulse) across the memory cell 505 in a second polarity, which can be opposite to the first polarity. The memory cell 505 is read by applying a voltage (e.g., a read pulse) across the terminals. In some embodiments, the memory cell 505 is read by applying a voltage across the memory cell 505 in the first polarity. In other embodiments, the memory cell 505 is read by applying a voltage across the memory cell 505 in the second polarity. The memory cell 505 can always be read with the same polarity. When the memory cell 505 is read with a voltage in the same voltage polarity with which the memory cell 505 was written, the memory cell 505 can exhibit a first threshold voltage. When the memory cell 505 is read with a voltage in the opposite voltage polarity with which the memory cell 505 was written, the memory cell can exhibit a second threshold voltage. The different threshold voltages can be used to represent different data states.

When the memory cell 505 is a two-terminal device, the relative values of the voltages between the terminals determines the magnitude and the polarity of the voltage applied across the memory cell 505. For example, providing a voltage of 3 volts to the sense line 515 and 0 volts to the access line 510 results in the same magnitude and polarity of voltage as providing a voltage of 6 volts at the sense line 515 and 3 volts at the access line 510. Other non-negative (e.g., 0 volts or greater), negative, and/or positive voltages can be provided to the access line 510 and/or the sense line 515 in some embodiments. As used herein, forward polarity indicates that the sense line 515 is set at a higher voltage than the access line 510 and reverse polarity indicates that the sense line 515 is set at a lower voltage than the access line 510. However, the use of "forward" and "reverse" polarities is by way of example, and the embodiments of the invention are not limited to those of the particular polarity direction described herein.

Figure 6:
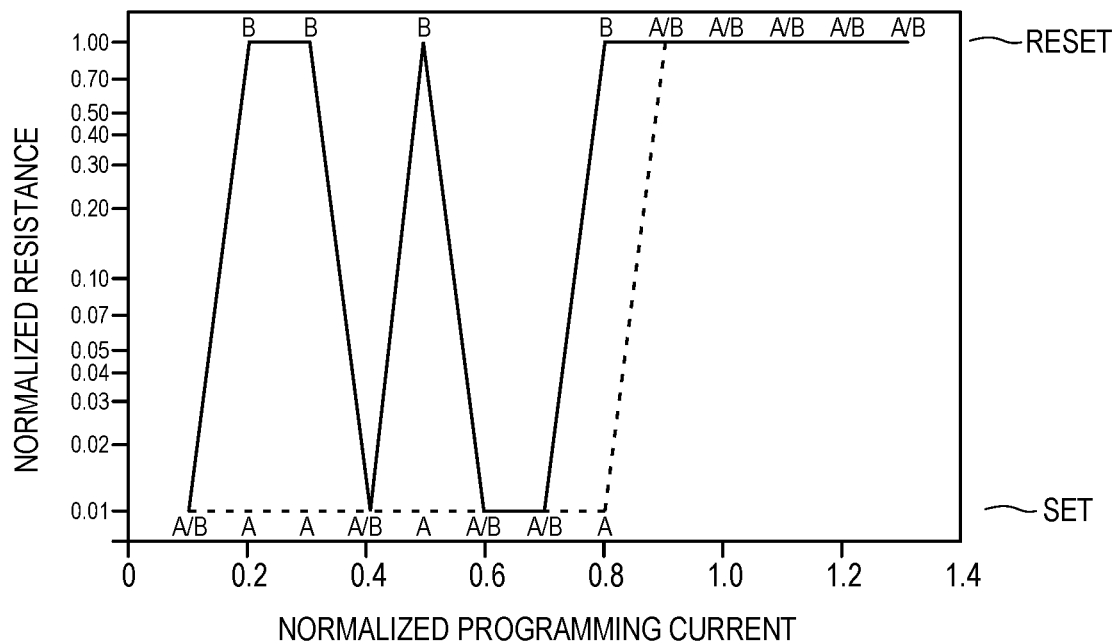
FIG. 6 illustrates a normalized representation of resistance versus programming current for generation of random data according to a number of embodiments of the present disclosure.

FIG. 6 illustrates a normalized representation of resistance versus programming current for generation of random data according to a number of embodiments of the present disclosure. The resistance represented in FIG. 6 can be that associated with memory elements of the second portion 124 of memory 130 illustrated in FIG. 1. In one example, a phase change material such as a chalcogenide material can be utilized as a random number generator by first applying a programming or RESET signal to the device having a current that is sufficient to set the chalcogenide material to a high resistance state (e.g., an amorphous state or a state that is detectable as the amorphous state). A subsequent pulse (e.g., a programming or random number generation current) is then applied to the chalcogenide material, which is in the RESET state, where the pulse has a value that is less than pulses associated with the RESET state (e.g., the high current), but greater than pulses associated with the SET state (e.g., the low current generally used to set the material to the low state). The pulse may cause the chalcogenide material to melt and re-solidify into either the RESET state or the SET state, where the probability of a given state is effectively random. By setting one or more cells of a chalcogenide material to a RESET state and subsequently applying such a pulse to the material, an effective hardware-based random number generator can be achieved.

The pulse used to generate the random state fluctuation in the chalcogenide material can be any current, both in terms of the electrical properties and/or the temporal characteristics of the current, which can cause the material to randomly achieve different states. In the example of FIG. 6, the dotted line (A) represents the chalcogenide material initially solidified to the SET state where an intermediate or random number generating current is applied at increasing current values. In this case, the state of the chalcogenide re-solidifies to the SET state until the current is increased to a point whereby the material solidifies to the RESET state. No random fluctuations are seen for this particular data set, which can be seen in the normalized resistance along the y-axis of the graph. The SET state is crystalline, and therefore has a low resistance, while the RESET state is amorphous, and thus has a high resistance. The solid line (B), however, which represents chalcogenide material initially solidified to the RESET state, shows random fluctuations in the material between the RESET state and the SET state as the current is increased. These random fluctuations are represented graphically as the solid line moves back and forth between the top and bottom of the graph due to the resistance changes in the material at different states.

Figure 7:
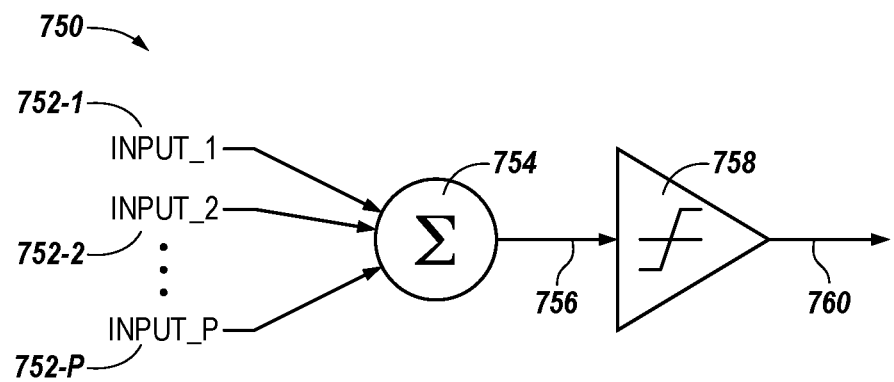
FIG. 7 illustrates a graphical example of a neuron model according to a number of embodiments of the present disclosure.

FIG. 7 illustrates a graphical example of a neuron model 750 according to a number of embodiments of the present disclosure. A neuron model can be used to attempt to mimic a neuron of a human brain, for example. A typical structure of neural networks is to mimic networks of neurons, such as found in a human brain, by utilizing small building blocks (e.g., neuron models) to attempt to emulate the neurons of a neural network. These neuron models are sometimes referred to as perceptrons. The neuron model 750 includes a number of inputs 752-1, 752-2, . . . , 752-P. The signals applied to the inputs 752 can be generated responsive to sensing some form of stimuli, such as a voltage, a current or a particular data value (e.g., binary digits), for example. The neuron model 750 includes a function, such as a summation function 754, to process signals received on the inputs 752. For example, the summation function 754 might perform an addition operation on signals received at the inputs 752. The neuron model 750 further comprises a function 758 to respond to a value corresponding to the summed inputs 756 and to generate a particular response at the output 760.

An example of the function 758 is a function to determine a difference between the summed value 756 and a known correct output. Such a function can generate an output 760 comprising the difference, for example. Other examples of the function 758 include non-linear functions, such as a sigmoid function. The generated output value at the output 760 can be applied to one or more additional neuron models (e.g., such as to inputs 752 of different neuron models) which comprise a neural network of neuron models according to various embodiments of the present disclosure. In some embodiments, the output 760 can be sent to a controller, such as the controller 140 illustrated in FIG. 1.

Figure 8:
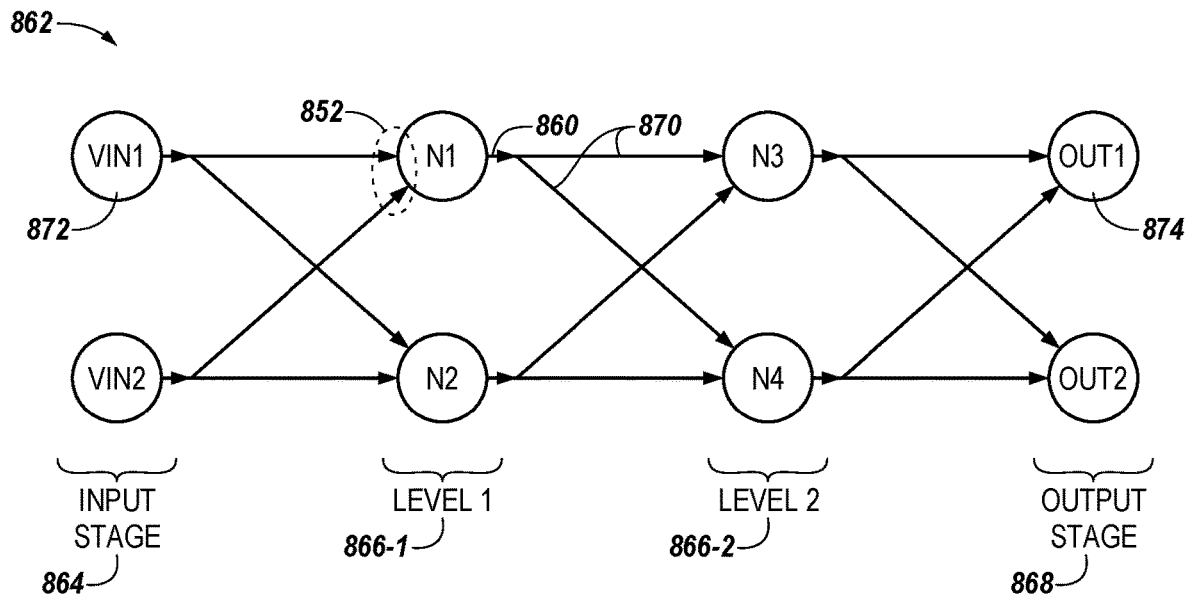
FIG. 8 illustrates a graphical representation of a neural network according to a number of embodiments of the present disclosure.

FIG. 8 illustrates a graphical representation of a neural network 862 according to a number of embodiments of the present disclosure. The neural network 862 comprises an input stage 864, a first level 866-1 of neuron models (N1, N2), a second level 866-2 of neuron models (N3, N4), and an output stage 868. Neural networks according to various embodiments can include many more than two inputs, two outputs, and two levels. Any of the neuron models N1, N2, N3, N4 can be analogous to the neuron model 750 illustrated in FIG. 7. The arrows indicated at 752 correspond to the first input 752-1 and the second input 752-2 in FIG. 7, whereas the output 860 corresponds to the output 760 shown in FIG. 7. The output of neuron model N1 can be applied to one or more different neuron models of the network such as indicated by arrows 870. Thus, the output of each neuron model of the first level 866-1 is applied to an input of each neuron model of the second level 866-2 of the neural network 862, for example.

The input stage 864 comprising initial input signals (VIN1, VIN2) to the neural network 862 can be supplied by additional circuitry of an electronic system incorporating the neural network. Each input node 872 can include circuitry such as registers and/or driver circuits, for example. The output stage 868 is configured to transfer neural network output values to additional circuitry of the electronic system. Output nodes 874 can include circuitry such as registers and/or driver circuits, for example.

In an example implementation of a neural network according to the present disclosure, each neuron can fire based on a current stimulus. A set of addresses from a memory array can represent a synapse. One or more memory elements can be programmed with values representing synaptic weights. Memory elements associated with the set of addresses can be read and the output can be converted to a signal through a digital-to-analog converter. A weight change algorithm, such as random weight change, can be used in a learning phase, where the correct output is known. After a weight change, if a difference between the output of the neural network and the known correct output is decreased, then the weights can be changed by a same amount as the previous change (e.g., linearly). This may also be referred to as a short search in a neighborhood in the search space. After a weight change, if the difference between the output of the neural network and the known correct output is increased, then the weights can be changed randomly. This may also be referred to as a jump to a completely random neighborhood in the search space. One functional component of a neural network is pattern recognition through training of the neural network. Heuristic search algorithms may use a random walk over a multidimensional search space. The weight adjustment can use any approach, such as or similar to a stochastic gradient descent, such as simulated annealing or a genetic algorithm, which minimizes the difference between the output and the known correct output. In some embodiments, the neural network can use a heuristic search to detect patterns in incoming data.

Figure 9:
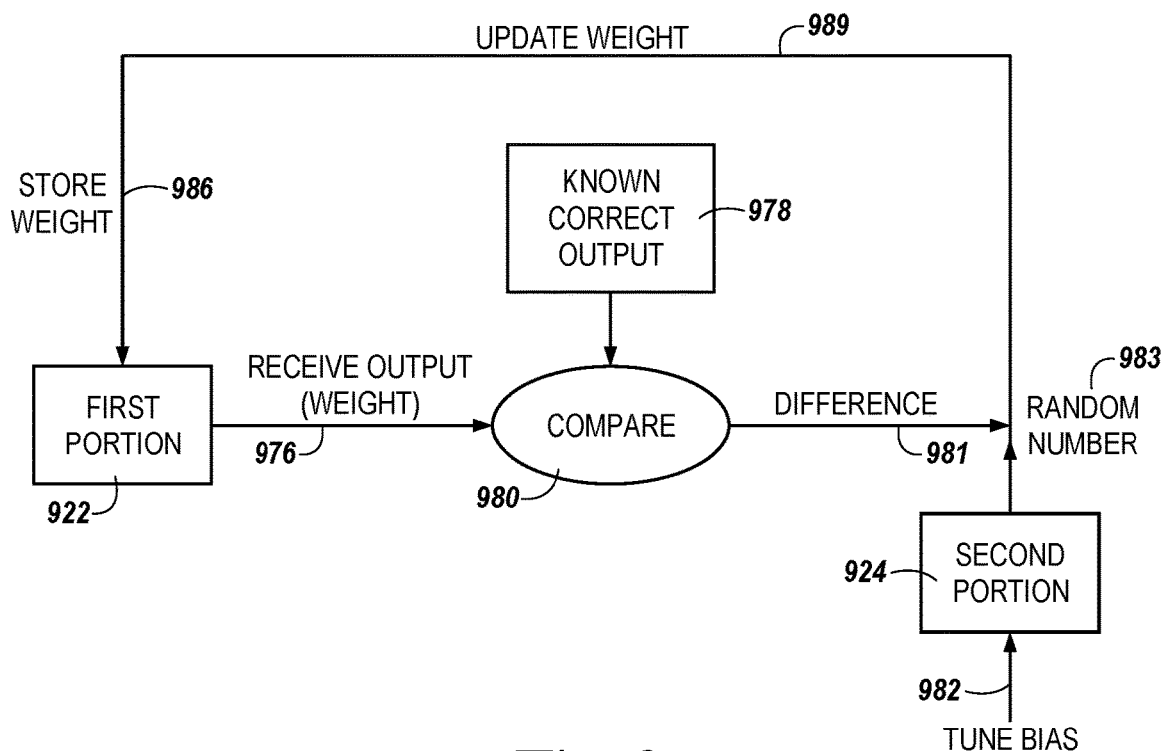
FIG. 9 is a method flow diagram for weight update in a neural network according to a number of embodiments of the present disclosure.

FIG. 9 is a method flow diagram for weight update in a neural network according to a number of embodiments of the present disclosure. In at least one embodiment, the method can be performed by the controller 140 illustrated in FIG. 1. The method can include receiving an output representing synaptic weights of a neural network from a first plurality of memory elements. The first plurality of memory elements can be a first portion 922 of memory. The method can include receiving the output (e.g., weights) from the first portion 922 as illustrated at 976. In some embodiments, receiving the output can include reading memory elements associated with the first portion 922. The method can include comparing the output to a known correct output 978 as indicted at 980. The method can include generating a random number 983 with a tuned bias 982 via a second plurality of memory elements. The second plurality of memory elements can be a second portion 924 of memory. The method can include updating the weights based on the random number 983 and a difference 981 between the output and the known correct output 978 as indicated at 984. Updating the weights can include programming the first plurality of memory elements to store the updated weights as indicated at 986.

Generating the random number 983 can include applying a pulse to a quantity of the second plurality of memory elements, the pulse having a magnitude between pulses associated with a RESET state and a pulse associated with a SET state of the second plurality of memory elements in the second portion 924 of memory. Generating the random number 983 can include reading the second plurality of memory elements after applying the pulse. Generating the random number with the tuned bias can include defining the quantity based on the difference.

For example, a lesser quantity of the second plurality of memory elements of the second portion 924 can be defined in response to a decrease in the difference 981 and a greater quantity can be defined in response to an increase in the difference 981. The greater the quantity of memory elements that are defined from the second portion 924 for having the pulse applied thereto, the greater the randomness of the resulting random number 983 output from the second portion 924 of memory will be. This is so because the greater quantity having the pulse applied thereto means that a larger percentage of the memory elements of the second portion 924 will effectively have their states randomized between SET and RESET. Increasing the randomness of the random number 983 in response to an increase in the difference 981 between the output and the known correct output allows the search algorithm to jump to a different search space because the current search is getting further away from the correct result. Decreasing the randomness of the random number 983 in response to a decrease in the difference 981 between the output and the known correct output allows the search algorithm to narrow in on the correct result. This can promote the search algorithm to settle into a local or global minimum difference.

As another example, a greater quantity of the second plurality of memory elements can be defined in response to a convergence in the difference 981 after multiple iterations. This can be beneficial to increase the search space after the search algorithm settles into a local minimum. For example, this can allow the search algorithm to escape the local minimum to search for another local minimum, which can promote a determination of a global minimum by comparison of multiple saved local minima. The output of the first plurality of memory elements of the first portion 922, representing the synaptic weights, can be stored for each of a plurality of convergences in the difference 981 after multiple iterations. This can enable the comparison of multiple saved local minima to determine a global minimum (e.g., a best-fit output to the known correct output). One of the stored outputs can be selected as the best-fit output. A greater or lesser quantity can be selected based on a topography of values of outputs corresponding to the plurality of convergences.

Figure 10:
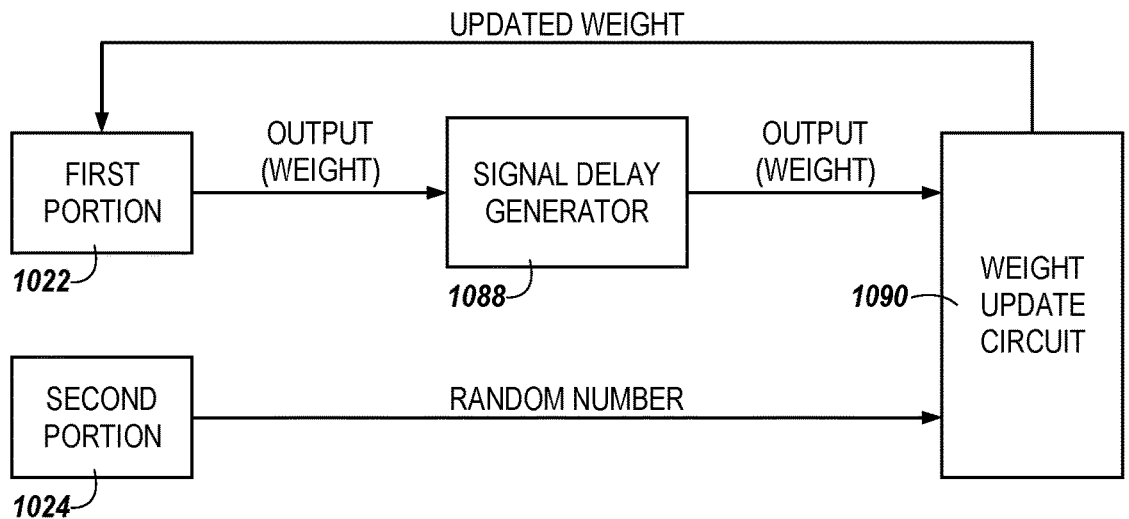
FIG. 10 is a functional block diagram for weight update in a neural network according to a number of embodiments of the present disclosure.

FIG. 10 is a functional block diagram for weight update in a neural network according to a number of embodiments of the present disclosure. A first portion 1022 of memory can include a first plurality of memory elements and a second portion 1024 of memory can include a second plurality of memory elements, comprising resistance variable memory elements. In at least one embodiment, the first plurality of memory elements are memory elements other than resistance variable memory elements. The first portion 1022 and the second portion 1024 can be coupled to a controller (not specifically illustrated, but analogous to the controller 140 illustrated in FIG. 1). The controller can be configured to compare an output of the first plurality of memory elements, representing synaptic weights of a neural network, to a known correct output. The controller can be configured to cause the second plurality of memory elements to generate a random number with a tuned bias based on a difference between the output of the first plurality of memory elements and the known correct output.

A weight update circuit 1090 can be coupled to the first portion 1022 of memory including the first plurality of memory elements and to the second portion 1024 of memory including the second plurality of memory elements. In at least one embodiment, the weight update circuit 1090 can be a component of the controller. In at least one embodiment, the weight update circuit 1090 can comprise hardware logic separate from the controller.

The weight update circuit 1090 can be configured to cause randomly updated synaptic weights to be stored in the first plurality of memory elements based on the random number in response to an increase in difference between the output and the known correct output. The randomly updated synaptic weights can be beneficial for instances in which the difference increases because the randomly updated synaptic weights essentially causes the neural network to expand its search for the correct output. The weight update circuit 1090 can be configured to cause linearly updated synaptic weights to be stored in the first plurality of memory elements in response to a decrease in difference between the output and the known correct output. The linearly updated synaptic weights can be beneficial for instances in which the difference decreases because the linearly updated synaptic weights essentially causes the neural network to narrow its search for the correct output. The weight update circuit 1090 can comprise and adder and/or a multiplier circuit to update the synaptic weights.

In some embodiments, the weight update circuit 1090 can be directly connected to the second portion 1024 of memory and receive the random number therefrom. The weight update circuit 1090 can be coupled to the first portion 1022 via a signal delay generator 1088. The signal delay generator can be configured to delay the passing of the output (e.g., generated as a function of synaptic weights) from the first portion 1022 to the weight update circuit 1090. In some embodiments, the delay can be useful where generation of the random number may take some time. The signal delay generator 1088 can be configured to delay the output of the first plurality of memory elements until the random number is generated by the second plurality of memory elements.

Figure 11:
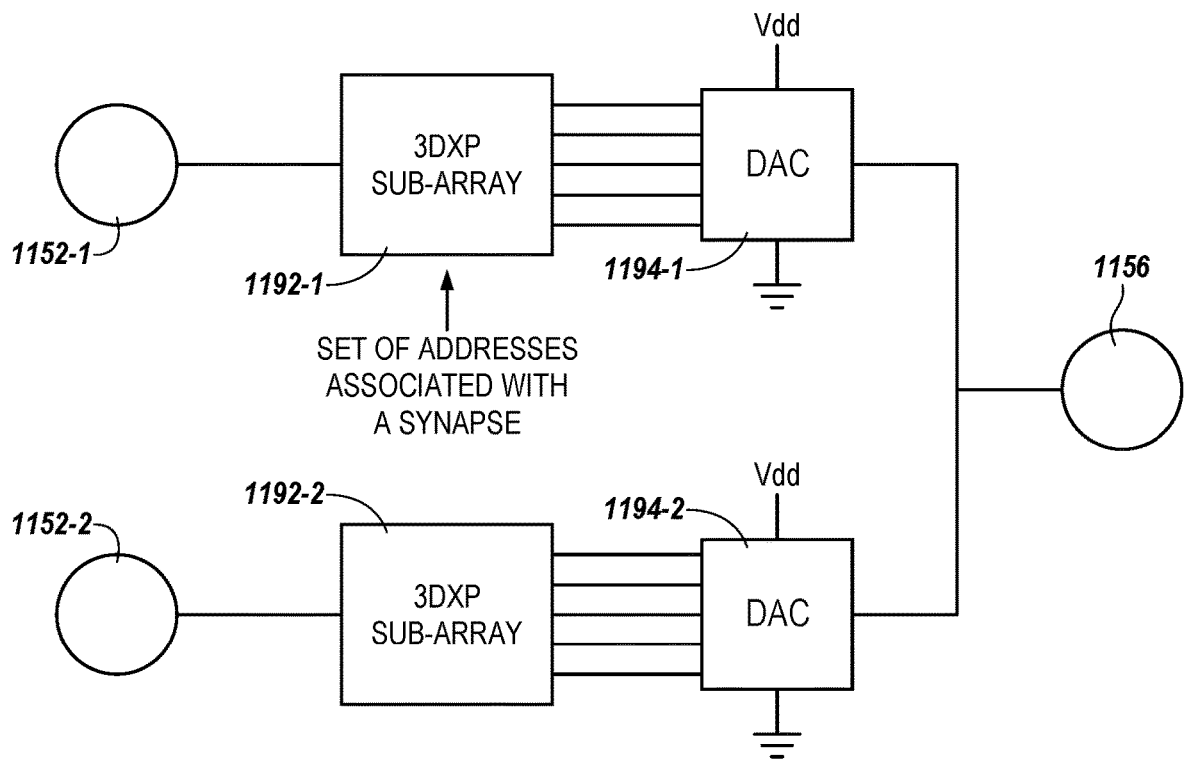
FIG. 11 is a block diagram of an example implementation of a neural network according to a number of embodiments of the present disclosure.

FIG. 11 is a block diagram of an example implementation of a neural network according to a number of embodiments of the present disclosure. The neural network includes a first input 1152-1 and a second input 1152-2, however embodiments are not limited to a particular number of inputs 1152. The first input 1152-1 is to a first subset 1192-1 of memory elements and the second input 1152-2 is to a second subset 1192-2 of memory elements. The first subset 1192-1 of memory elements outputs to a first digital-to-analog converter 1194-1 and the second subset 1192-2 of memory elements outputs to a second analog-to-digital converter 1194-2. The analog-to-digital converters 1194 provide an output 1156. Although not specifically illustrated as such, the output 1156 can be multiplexed from the analog-to-digital converters 1194. The subsets 1192 of memory elements can represent a synapse of the neural network.

The subsets 1192 of memory elements illustrated in FIG. 11 can be the first plurality of memory elements in the first portion 122 of memory 130 illustrated in FIG. 1. The subsets 1192 can be part of a first array that includes additional subsets. The second plurality of memory elements, which can in the second portion 124 illustrated in FIG. 1, can be at least a portion of a second array. However, in some embodiments, the subsets 1192 and the second plurality of memory cells can be part of a same array. The controller (e.g., the controller 140 illustrated in FIG. 1) can be configured to store respective synaptic weights in the additional subsets and operate the subsets 1192 and the additional subsets as the neural network.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method, comprising:
    receiving an output from a first plurality of memory elements representing a plurality of synaptic weights of a neural network;
    comparing the output to a known correct output;
    generating a random number with a tuned bias via a second plurality of memory elements, wherein generating the random number comprises:
        applying a pulse to a quantity of the second plurality of memory elements, the pulse having a magnitude between pulses associated with a RESET state and a pulse associated with a SET state of the second plurality of memory elements;
        defining the quantity based on a difference between the output and the known correct output; and
        reading the second plurality of memory elements after applying the pulse; and
    updating the plurality of synaptic weights based on the random number and the difference between the output and the known correct output.

2. The method of claim 1, wherein updating the plurality of synaptic weights comprises programming the first plurality of memory elements to store the updated plurality of synaptic weights.

3. An apparatus, comprising:
    a first plurality of memory elements;
    a second plurality of memory elements comprising resistance variable memory elements; and
    a controller coupled to the first and the second pluralities of memory elements, wherein the controller is configured to:
        compare an output of the first plurality of memory elements, representing a plurality of synaptic weights of a neural network, to a known correct output;
        cause the second plurality of memory elements to generate a random number with a tuned bias based on a difference between the output of the first plurality of memory elements and the known correct output; and
        program the first plurality of memory elements to store an updated plurality of synaptic weights based on the random number.

4. The apparatus of claim 3, wherein the controller configured to cause the second plurality of memory elements to generate a random number comprises the controller configured to:
    RESET a quantity of the second plurality of memory elements; and
    apply a pulse to the quantity of the second plurality of memory elements, the pulse having a magnitude between pulses associated with a RESET state and a pulse associated with a SET state.

5. The apparatus of claim 3, wherein the random number comprises an output of the second plurality of memory elements; and
    wherein the controller is configured to define a quantity of the second plurality of memory elements of which to tune the bias.

6. The apparatus of claim 5, wherein the controller is configured to define a lesser quantity in response to a decrease in the difference.

7. The apparatus of claim 5, wherein the controller is configured to define a greater quantity in response to an increase in the difference.

8. The apparatus of claim 5, wherein the controller is configured to define a greater quantity in response to a convergence in the difference after multiple iterations.

9. The apparatus of claim 8, wherein the controller is configured to cause the output of the first plurality of memory elements, representing the plurality of synaptic weights, to be stored for each of a plurality of convergences in the difference after multiple iterations.

10. The apparatus of claim 9, wherein the controller is configured to select one of the stored outputs as a best-fit output.

11. The apparatus of claim 9, wherein the controller is configured to define the greater quantity based on a topography of values of outputs corresponding to the plurality of convergences.

12. The apparatus of claim 3, wherein the first plurality of memory elements comprises a subset of a first memory array, the first memory array including additional subsets of memory elements;
   wherein the controller is configured to:
      store a additional synaptic weights in the additional subsets; and
      operate the subset and the additional subsets as the neural network; and
   wherein the second plurality of memory elements comprises at least a portion of a second memory array.

13. The apparatus of claim 3, wherein the first plurality of memory elements comprises a subset of a memory array, the memory array further including additional subsets of memory elements and the second plurality of memory elements.

14. The apparatus of claim 3, wherein the first plurality of memory elements comprise self-selecting memory (SSM) elements.

15. The apparatus of claim 3, wherein the first plurality of memory elements comprise 3D cross-point memory elements.

16. The apparatus of claim 3, wherein the second plurality of memory elements include a phase change material.

17. An apparatus, comprising:
   a first plurality of memory elements;
   a second plurality of memory elements comprising resistance variable memory elements;
   a controller coupled to the first and the second pluralities of memory elements, wherein the controller is configured to:
      compare an output of the first plurality of memory elements, representing a plurality of synaptic weights of a neural network, to a known correct output; and
      cause the second plurality of memory elements to generate a random number with a tuned bias based on a difference between the output of the first plurality of memory elements and the known correct output; and
   a weight update circuit coupled to the first and the second pluralities of memory elements, wherein the weight update circuit is configured to:
      cause a randomly updated plurality of synaptic weights to be stored in the first plurality of memory elements based on the random number in response to an increase in a difference between the output and the known correct output.

18. The apparatus of claim 17, wherein the weight update circuit is configured to cause a linearly updated plurality of synaptic weights to be stored in the first plurality of memory elements in response to a decrease in difference between the output and the known correct output.

19. The apparatus of claim 18, wherein the weight update circuit comprises an adder circuit.

20. The apparatus of claim 17, wherein the weight update circuit is configured to:
   receive the random number from the second plurality of memory elements; and
   receive the output of the first plurality of memory elements.

21. The apparatus of claim 20, further comprising a signal delay generator coupled between the first plurality of memory elements and the weight update circuit;
   wherein the signal delay generator is configured to delay the output of the first plurality of memory elements until the random number is generated by the second plurality of memory elements.

22. The apparatus of claim 17, wherein:
   the first plurality of memory elements comprises a first subset and a second subset;
   the first subset is coupled to a first digital to analog converter;
   the second subset is coupled to a second digital to analog converter;
   the first DAC and the second DAC are coupled to multiplexor;
   the multiplexor is configured to provide the output of the first plurality of memory elements; and
   the first subset and the second subset represent a synapse of the neural network.

23. The apparatus of claim 17, wherein the weight update circuit comprises a component of the controller.

24. The apparatus of claim 17, wherein the weight update circuit comprises hardware logic separate from the controller.

25. The apparatus of claim 17, wherein the first plurality of memory elements comprise memory elements other than resistance variable memory elements.

* * * * *